(12) United States Patent
Zhou et al.

(10) Patent No.: US 10,042,255 B2
(45) Date of Patent: Aug. 7, 2018

(54) BLOCK COPOLYMERS AND PATTERN TREATMENT COMPOSITIONS AND METHODS

(71) Applicants: Rohm and Haas Electronic Materials LLC, Marlborough, MA (US); Dow Global Technologies LLC, Midland, MI (US)

(72) Inventors: Huaxing Zhou, Furlong, PA (US); Vipul Jain, North Grafton, MA (US); Jin Wuk Sung, Northborough, MA (US); Peter Trefonas, III, Medway, MA (US); Phillip D. Hustad, Pearland, TX (US); Mingqi Li, Shrewsbury, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/297,526

(22) Filed: Oct. 19, 2016

(65) Prior Publication Data

US 2017/0123316 A1 May 4, 2017

Related U.S. Application Data

(60) Provisional application No. 62/249,263, filed on Oct. 31, 2015.

(51) Int. Cl.
*G03F 7/004* (2006.01)
*G03F 7/038* (2006.01)
*C09D 183/10* (2006.01)
*G03F 7/40* (2006.01)
*G03F 7/11* (2006.01)
(Continued)

(52) U.S. Cl.
CPC ............ *G03F 7/038* (2013.01); *C08F 293/00* (2013.01); *C08F 293/005* (2013.01);
(Continued)

(58) Field of Classification Search
CPC . G03F 7/002; G03F 7/165; G03F 7/32; G03F 7/40; G03F 7/11; C08L 53/00;
(Continued)

(56) References Cited

U.S. PATENT DOCUMENTS 9,223,214 B2 12/2015 Cho et al.
9,242,243 B2 1/2016 Zhou et al.
(Continued)

FOREIGN PATENT DOCUMENTS

| | | |
|---|---|---|
| JP | 2016069606 A | 5/2016 |
| WO | 2014127430 A1 | 8/2014 |
| WO | 2015037467 A1 | 3/2015 |

OTHER PUBLICATIONS

Cheng, et al, "EUVL compatible, LER solutions using functional block copolymers", Proc. of SPIE, 2012, pp. 832310-1 thru 832310-11, vol. 8323.
(Continued)

*Primary Examiner* — Amanda C Walke
(74) *Attorney, Agent, or Firm* — Jonathan D. Baskin

(57) ABSTRACT

Block copolymers comprise a first block comprising an alternating copolymer, and a second block comprising a unit comprising a hydrogen acceptor. The block copolymers find particular use in pattern shrink compositions and methods in semiconductor device manufacture for the provision of high resolution patterns.

18 Claims, 3 Drawing Sheets

(51) Int. Cl.
G03F 7/16 (2006.01)
C08L 53/00 (2006.01)
C09D 153/00 (2006.01)
H01L 21/027 (2006.01)
H01L 21/311 (2006.01)
C08F 293/00 (2006.01)
G03F 7/20 (2006.01)
G03F 7/32 (2006.01)

(52) U.S. Cl.
CPC ............ *C08L 53/00* (2013.01); *C09D 153/00* (2013.01); *C09D 183/10* (2013.01); *G03F 7/0045* (2013.01); *G03F 7/11* (2013.01); *G03F 7/162* (2013.01); *G03F 7/165* (2013.01); *G03F 7/168* (2013.01); *G03F 7/2004* (2013.01); *G03F 7/325* (2013.01); *G03F 7/40* (2013.01); *H01L 21/0274* (2013.01); *H01L 21/31144* (2013.01); *B81C 2201/0149* (2013.01); *C08F 2438/03* (2013.01)

(58) Field of Classification Search
CPC ................ C09D 153/00; C09D 183/10; B81C 2201/0149; H01L 21/0274; H01L 21/31144
USPC ...... 430/270.1, 271.1, 273.1, 322, 325, 329, 430/330, 331; 525/280, 294
See application file for complete search history.

(56) References Cited

U.S. PATENT DOCUMENTS

| | | | |
|---|---|---|---|
| 2010/0297847 A1* | 11/2010 | Cheng | B81C 1/00031 438/694 |
| 2013/0209755 A1* | 8/2013 | Hustad | B81C 1/00031 428/195.1 |
| 2013/0210231 A1 | 8/2013 | Senzaki et al. | |
| 2013/0344242 A1* | 12/2013 | Willson | B81C 1/00031 427/240 |
| 2015/0086929 A1 | 3/2015 | Hatakeyama et al. | |
| 2015/0287592 A1* | 10/2015 | Park | G03F 7/0002 438/702 |
| 2015/0338744 A1 | 11/2015 | Hatakeyama et al. | |
| 2015/0370159 A1* | 12/2015 | Willson | C09D 137/00 428/447 |
| 2016/0033869 A1 | 2/2016 | Hustad et al. | |
| 2016/0304740 A1* | 10/2016 | Cheng | C09D 169/00 |

OTHER PUBLICATIONS

Namie, et al, "Polymer blends for directed self-assembly", Proc. of SPIE, 2013, pp. 86801M-1 thru 86801M-5, vol. 8680.

Oyama, et al, "The enhanced photoresist shrink process technique toward 22nm node", Proc. of SPIE, 2011, pp. 79722Q-1 thru 79722Q-6, vol. 7972.

Chuang, et al, "Using directed self assembly of block copolymer nanostructures to modulate nanoscale surface roughness: towards a novel lithographic process", Adv. Funct. Mater., 2013, pp. 173-183, vol. 23.

Chen, et al, "Synthesis of alternating copolymers of N-substituted maleimides with styrene via atom transfer radical polymerization", Macromolecules, 2000, pp. 232-234, vol. 33.

Co-Pending U.S. Appl. No. 15/172,228, filed Jun. 3, 2016.

Search report for corresponding Taiwan Application No. 105133101 dated May 5, 2017.

* cited by examiner

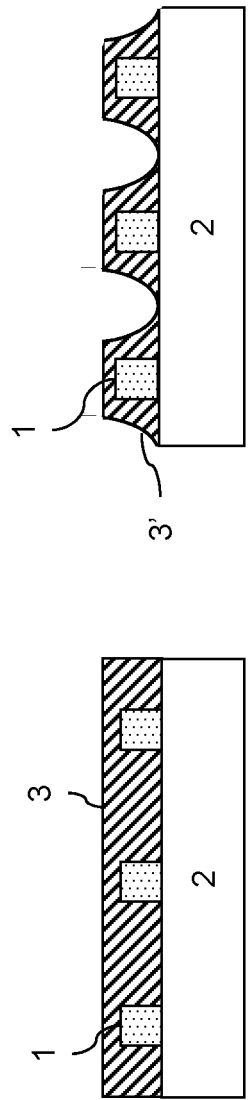

BLOCK COPOLYMERS AND PATTERN TREATMENT COMPOSITIONS AND METHODS

FIELD OF THE INVENTION

The invention relates generally to the manufacture of electronic devices. More specifically, this invention relates to block copolymers, to pattern treatment compositions containing a block copolymer and to pattern treatment methods using the pattern treatment compositions. The invention finds particular use in the manufacture of semiconductor devices in shrink processes for the formation of fine patterns.

BACKGROUND OF THE INVENTION

In the semiconductor manufacturing industry, to extend resolution capabilities beyond those obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth, thermal flow and polymer blend self-assembly.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ Revolution", *Semiconductor International*, 1999. 9), an acid-catalyzed crosslinkable material is coated over a resist patterned surface. Crosslinking of the material is catalyzed by an acid component present in the resist pattern that diffuses into the crosslinkable material during a baking step. The crosslinking takes place in the material in the vicinity of the resist pattern in the acid diffusion region to form a coating on sidewalls of the pattern, thereby reducing the lateral dimension of open areas of the pattern. This process typically suffers from iso-dense bias (IDB), wherein growth of the crosslinked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern. The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

A polymer grafting shrink technique has also been proposed (see, e.g., U.S. Patent Application Pub. No. 2015/0086929A1). As shown in FIGS. 1A and 1B, in this process, a photoresist pattern 1 and substrate 2 is overcoated with a shrink composition 3 containing a polymer having a group which bonds to the surface of the resist pattern. Following rinse of residual unbound polymer with a solvent, a layer 3 of the bonded polymer from the shrink composition remains over the photoresist pattern. The inventors have observed that attachment of the polymer to the resist pattern can result in a scumming (or footing) layer 3' being formed on the substrate surface. It is believed that the occurrence of scumming can result from bonding of the polymer to the substrate surface and wetting of the polymer bonded to resist sidewalls onto the polymer bonded to the substrate. The occurrence of scumming is undesirable in that it can result in patterning defects, for example, bridging defects or missing contact holes, which can adversely impact device yield.

There is a continuing need in the art for improved pattern treatment methods which address one or more problems associated with the state of the art and which allow for the formation of fine patterns in electronic device fabrication.

SUMMARY

In accordance with a first aspect of the invention, block copolymers are provided. The block copolymers comprise a first block comprising an alternating copolymer, and a second block comprising a unit comprising a hydrogen acceptor. In accordance with a preferred aspect of the invention, the hydrogen acceptor is a group chosen from amine, imine, diazine, diazole, optionally substituted pyridine, and combinations thereof. The alternating copolymer preferably comprises a repeat unit of the following general formula (I):

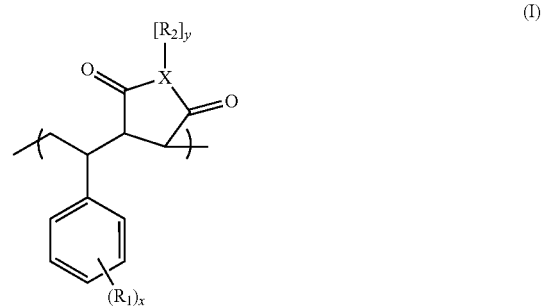

wherein: $R_1$ is independently chosen from halogen, hydroxyl, optionally substituted C1-10 alkyl, C1-10 alkoxy, C1-10 carboxyl, optionally substituted C6-14 aryl and optionally substituted C6-14 aryloxy; $R_2$ is chosen from hydrogen, optionally substituted C1-10 alkyl and optionally substituted C6-14 aryl; X is an oxygen or nitrogen atom; x is an integer from 0 to 5; and y is 0 or 1, provided that when X is an oxygen atom, y is 0, and when X is a nitrogen atom, y is 1. The alternating copolymer more preferably comprises a repeat unit of the following general (I-1) or (I-2):

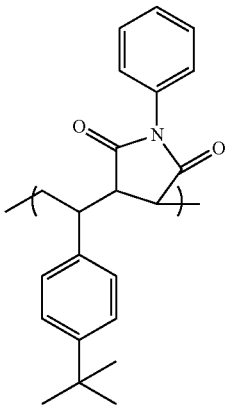

(I-1)

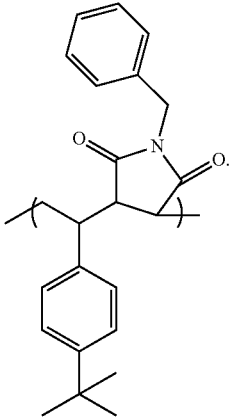

(I-2)

In accordance with a further aspect of the invention, pattern treatment compositions are provided. The pattern treatment compositions comprise a block copolymer as described herein and a solvent. In accordance with a further aspect of the invention, pattern treatment methods are provided. The methods comprise: (a) providing a substrate comprising a patterned feature on a surface thereof; (b) applying a pattern treatment composition as described herein to the patterned feature; and (c) rinsing residual pattern treatment composition from the substrate, leaving a portion of the block copolymer bonded to the patterned feature. The patterned feature is preferably a photoresist pattern, and preferably a photoresist pattern that is formed by a negative tone development process.

The terminology used herein is for the purpose of describing particular embodiments only and is not intended to be limiting of the invention. The singular forms "a", "an" and "the" are intended to include singular and plural forms, unless the context indicates otherwise. Various materials and groups that are "optionally substituted" may be suitably substituted at one or more available positions. Except as otherwise specified, "substituted" shall be understood to mean including at least one substituent such as a halogen (i.e., F, Cl, Br, I), hydroxyl, amino, thiol, carboxyl, carboxylate, ester, ether, amide, nitrile, sulfide, disulfide, nitro, $C_{1-18}$ alkyl, $C_{1-18}$ alkenyl (including norbornenyl), $C_{1-18}$ alkoxyl, $C_{2-18}$ alkenoxyl (including vinyl ether), $C_{4-18}$ aryl, $C_{6-18}$ aryloxyl, $C_{7-18}$ alkylaryl, or $C_{7-18}$ alkylaryloxyl, optionally including one or more heteroatom. As used herein, the term "alkyl" includes linear alkyl, branched alkyl, cyclic (monocyclic or polycyclic) alkyl, and alkyl groups combining two-way and three-way combinations of linear, branched, and cyclic groups.

BRIEF DESCRIPTION OF THE DRAWINGS

The present invention will be described with reference to the following drawings, in which like reference numerals denote like features, and in which:

FIG. 1A-B shows in cross-section a substrate of the related art at various stages of pattern formation;

DETAILED DESCRIPTION

Block Copolymers

Figure 2A:
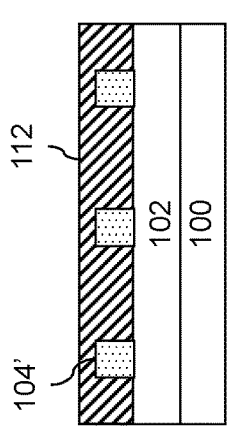
FIG. 2A-F is a process flow for a pattern treatment process in accordance with the invention.

Block copolymers of the invention include a first block that includes an alternating copolymer, and a second block that includes a unit containing a hydrogen acceptor. The block copolymers find particular use in compositions for treating photoresist patterns that can be used in shrink processes.

The block copolymers typically include two blocks, but may include more blocks, for example, triblocks, tetrablocks, or more blocks. One or more block may include a random copolymer. The blocks can be part of a linear copolymer, a branched copolymer where the branches are grafted onto a backbone (these copolymers are also sometimes called "comb copolymers"), a star copolymer, and the like.

Alternating copolymers generally belong to a class of copolymers in which two monomers react together to yield an alternating copolymer along the chain. As used herein, alternating polymer means that the polymer in the case of two distinct monomeric units A and B provides an ordered polymer of the form ABABAB . . . . Such polymerization preferably involves reaction of an electron acceptor monomer with an electron donating monomer. This polymerization is believed to occur via a chain transfer complex between the two monomers (see, e.g., Bamford, C. H.; Malley, P. J. J. Polym. Sci., Polym. Lett. Ed., 1981, 19, 239-247).

The alternating copolymer of the first block is comprised of a plurality of distinct units, with two distinct units being typical. The alternating copolymer typically includes a first unit comprising an electron donating group and a second unit comprising an electron accepting group. Suitable units comprising an electron donating group include, for example, the following:

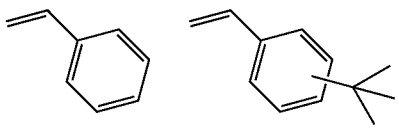

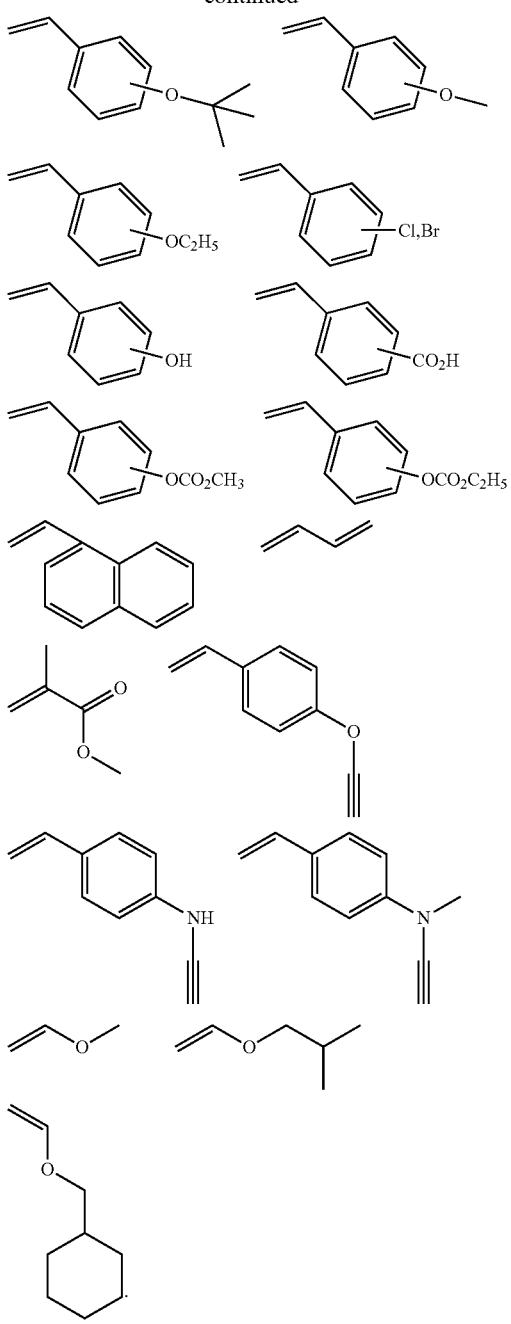
Suitable units comprising an electron accepting group include, for example, the following:
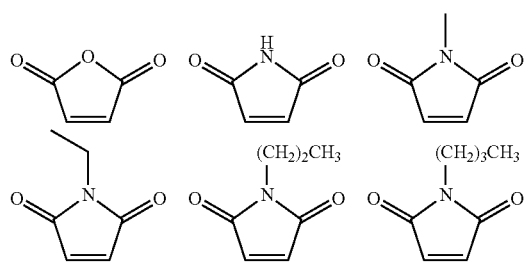
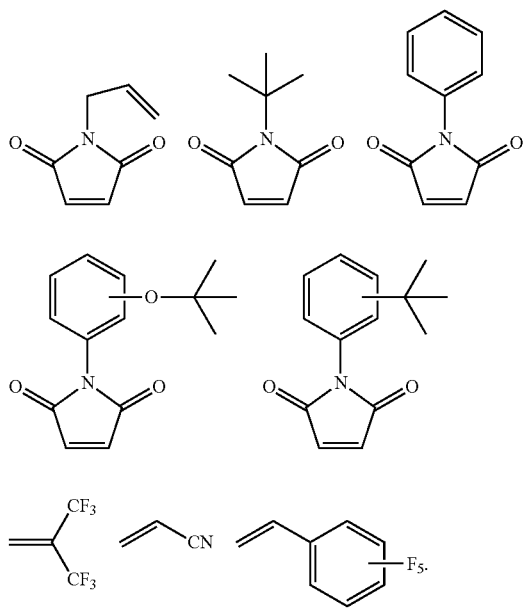
It will be appreciated that suitable alternating copolymers as the first block include, for example, any combination of electron donating group and electron accepting group as described above. Exemplary suitable alternating copolymers include the following:
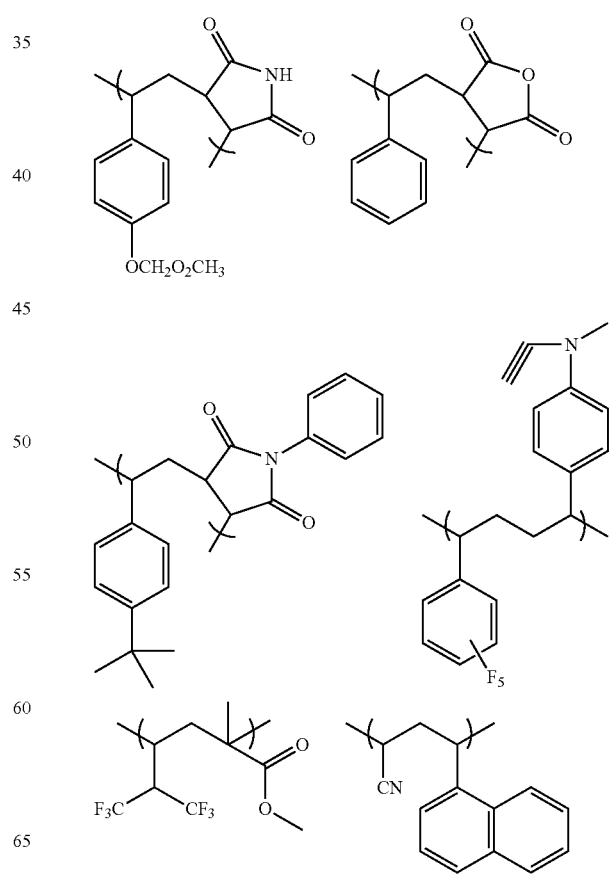

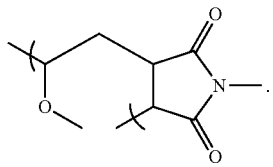

Particularly preferred alternating copolymers as the first block include a repeat unit of the following general formula (I):

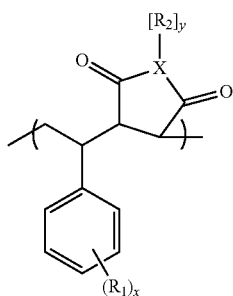

wherein: $R_1$ is independently chosen from halogen, hydroxyl, optionally substituted C1-10 alkyl, C1-10 alkoxy, C1-10 carboxyl, optionally substituted C6-14 aryl and optionally substituted C6-14 aryloxy; $R_2$ is chosen from hydrogen, optionally substituted C1-10 alkyl and optionally substituted C6-14 aryl; X is an oxygen or nitrogen atom, typically a nitrogen atom; x is an integer from 0 to 5; and y is 0 or 1, provided that when X is an oxygen atom, y is 0, and when X is a nitrogen atom, y is 1.

Preferred alternating copolymers of general formula (I) include the following:

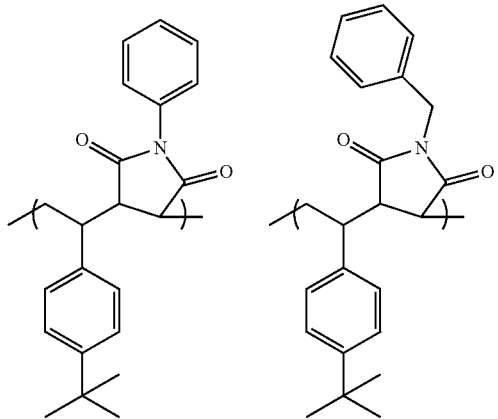

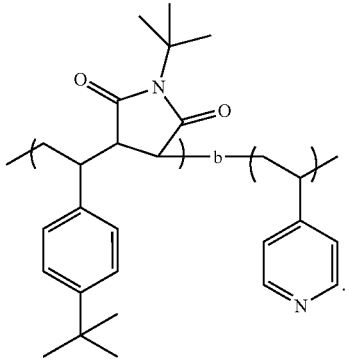

The second block of the block copolymer polymer includes a unit comprising a hydrogen acceptor which functions as a surface attachment group for forming a bond, for example, a hydrogen bond or an ionic bond, with a surface of a patterned photoresist feature. The hydrogen acceptor can be present, for example, as an endgroup or as a group pendant to the polymer backbone such as in one or more repeat unit of the second block. The particular site on the patterned feature surface with which the hydrogen acceptor forms a bond is typically a carboxylic acid and/or alcohol group present on the resist pattern surface, which groups may be present as a result of deprotection reaction during the resist patterning process. In this case, the hydrogen acceptor typically forms an ionic or hydrogen bond, with the deprotected acid group and/or alcohol group at exposed surfaces of the resist pattern. The block copolymer can become bonded (i.e., grafted) to the surface of the patterned feature through the hydrogen acceptor group to form a layer over the patterned resist feature.

Preferable hydrogen acceptor groups include, for example, one or more group chosen from: amines, for example, primary amines, secondary amines, and tertiary amines; imines, for example, primary and secondary aldimines and ketimines; diazines, for example optionally substituted pyrazine, piperazine, phenazine; diazole, for example, optionally substituted pyrazole, thiadiazole and imidazole; optionally substituted pyridine, for example, pyridine, 2-vinylpyridine and 4-vinylpyridine; and combinations thereof. The hydrogen acceptor group preferably takes the form of a ring pendant to the polymer backbone, for example, optionally substituted pyridine.

Suitable monomer units containing a surface attachment group include, for example, 2-(N,N-dimethylamino)ethyl methacrylate, 2-(N,N-dimethylamino)ethyl acrylate, 2-(N,N-diethylamino)ethyl methacrylate, 2-(tert-butylamino)ethyl methacrylate, 2-N-morpholinoethyl acrylate, 2-N-morpholinoethyl methacrylate, 3-dimethylaminoneopentyl acrylate, N-(t-BOC-aminopropyl) methacrylamide, N-[2-(N,N-dimethylamino)ethyl]methacrylamide, N-[3-(N,N-dimethylamino)propyl]acrylamide, N[3-(N,N-dimethylamino)propyl]methacrylamide, 2-vinylpyridine, 4-vinylpyridine, N-(3-aminopropyl)methacrylamide, 2-aminoethyl methacrylate, 4-N-tert-Butoxycarbonyl piperidine-1-methacrylate, 2-(dimethylamino)styrene, 4-(dimethylamino)styrene, 2-vinylpyridine, 4-vinylpyridine, and N-vinylpyrrolidone. When the pattern treatment polymer is based on polysiloxane chemistry, the monomer unit is typically an amine-functional siloxane monomer including, for example, n-(acetylglycyl)-3-aminopropyltrimethoxysilane, 3-(n-allylamino)propyltrimethoxysilane, allylaminotrimethylsilane, 4-aminobutyltriethoxysilane, 4-amino-3,3-dimethylbutylmethyldimethoxysilane, 4-amino-3,3-dimethylbutyltrimethoxysilane, n-(2-aminoethyl)-3-aminoisobutyldimethylmethoxysilane, n-(2-aminoethyl)-3-aminoisobutylmethyldimethoxysilane, (aminoethylaminomethyl)phenethyltrimethoxysilane, n-(2-aminoethyl)-3-aminopropylmethyldiethoxysilane, n-(2-aminoethyl)-3-aminopropylmethyldimethoxysilane, n-(2-aminoethyl)-3-aminopropyltriethoxysilane, n-(2-aminoethyl)-3-aminopropyltrimethoxysilane, n-(2-aminoethyl)-2,2,4-trimethyl-1-aza-2-silacyclopentane, n-(6-aminohexyl)aminomethyltriethoxysilane, n-(6-aminohexyl)aminomethyltrimethoxysilane, n-(2-aminoethyl)-11-aminoundecyltrimethoxysilane, 3-(m-aminophenoxy)propyltrimethoxysilane, m-aminophenyltrimethoxysilane, p-aminophenyltrimethoxysilane, n-3-[(amino(polypropylenoxy)]aminopropyltrimethoxysilane, 3-aminopropylmethyldiethoxysilane, 3-aminopropyltriethoxysilane, 3-aminopropyltrimethoxysilane, 11-aminoundecyltriethoxysilane, n-(2-n-benzylaminoethyl)-3-aminopropyltrimethoxysilane, n-butylaminopropyltrimethoxysilane, t-butylaminopropyltrimethoxysilane, (n-cyclohexylaminomethyl)triethoxysilane, (n-cyclohexylaminomethyl)trimethoxysilane, (n,n-diethyl-3-aminopropyl)trimethoxysilane, n,n-dimethyl-3-aminopropylmethyldimethoxysilane, (n,n-dimethyl-3-aminopropyl)trimethoxysilane, (3-(n-ethylamino)isobutyl)trimethoxysilane, n-methylaminopropylmethyldimethoxysilane, n-methylaminopropyltrimethoxysilane, (phenylaminomethyl)methyldimethoxysilane and n-phenylaminopropyltrimethoxysilane.

By selection of a suitable polymer, the thickness of the polymer on the patterned feature exposed surfaces can be accurately controlled. This thickness can be controlled, for example, by selection of a suitable molecular weight, with higher molecular weights typically resulting in greater thicknesses and lower molecular weights typically resulting in lesser thicknesses. The chemical composition of the polymer can also influence the amount of growth. For example, polymers with a longer unperturbed end-to-end distance or more rigid backbones can provide larger shrink for a given molecular weight. Preferred block copolymers are typically relatively high in rigidity due, for example, to a polymer backbone having a relatively low degree of freedom for bond rotation. This characteristic can result in greater removability during residual polymer rinsing in pattern treatment methods described herein.

The polymer should have good solubility in an organic solvent used in the composition and an organic solvent used to rinse and completely remove excess polymer (i.e., polymer not attached to the resist pattern) from the substrate. The content of the polymer in the shrink compositions will depend, for example, on the desired coating thickness of the shrink composition. The polymer is typically present in the compositions in an amount of from 80 to 100 wt %, more typically from 90 to 100 wt %, based on total solids of the shrink composition. The weight average molecular weight of the polymer is typically less than 400,000, preferably from 1000 to 200,000, more preferably from 1000 to 150,000 or 2000 to 125,000 g/mol.

The polymer preferably has good etch resistance to facilitate pattern transfer to one or more underlying layer. For carbon based polymers, the "Ohnishi parameter" can generally be used as an indicator of etch resistance of a polymer (J. Electrochem Soc, 143, 130 (1983), H. Gokan, S. Esho and Y. Ohnishi). The Ohnishi parameter is used in general to indicate the carbon density of a polymer and is specifically determined by the equation described in Formula (A):

$$N/(NC-NO) = \text{Ohnishi parameter} \quad (A)$$

where N is the combined total number of carbon atoms, hydrogen atoms and oxygen atoms, NC is the number of carbon atoms, and NO is the number of oxygen atoms. The increase of the carbon density of a polymer per unit volume (i.e., the decrease of the Ohnishi parameter) improves the etching resistance thereof. The Ohnishi parameter for carbon-based polymers useful in the invention is typically less than 4.5, preferably less than 4, and more preferably less than 3.5.

The pattern treatment compositions typically include a single polymer, but can optionally include one or more additional polymer as described above and/or other polymer. The polymers can be synthesized by known polymerization techniques to yield essentially mono disperse and highly controlled polymers. The polymers can, for example, be synthesized by RAFT (reversible addition fragmentation chain transfer), LAP (living anionic polymerization), NMP (nitroxide mediated polymerization) or ROMP (ring opening polymerization) techniques.

The polymer can be subjected to purification prior to being combined with the other components of the pattern treatment composition for removal of metallic and/or non-metallic impurities. Purification can involve, for example, one or more of washing, slurrying, centrifugation, filtration, distillation, decantation, evaporation and treatment with ion exchange beads.

Pattern Treatment Compositions

Pattern treatment compositions of the invention include a block copolymer as described herein and a solvent, and can include one or more additional, optional components. The compositions, when coated over a patterned feature, for example, a contact hole, trench or line and space pattern, can allow for a consistent shrink value regardless of feature size or density. That is, the compositions allow for a coated pattern exhibiting minimal or no proximity bias. Preferred compositions can provide a pattern that is substantially or completely free of scum. In addition, the pattern treatment compositions can be coated using a spin-coating tool, thereby allowing for simplified processing and ease in integration with the photoresist patterning process.

The pattern treatment composition solvent can be in the form of a single solvent or a mixture of solvents. Suitable solvent materials to formulate and cast the pattern treatment compositions exhibit excellent solubility characteristics with respect to the non-solvent components of the compositions, but do not appreciably dissolve an underlying photoresist pattern. The solvent can be an organic or aqueous solvent. Suitable organic solvents for the pattern treatment compositions include, for example: alkyl esters such as PGMEA, ethyl lactate, n-butyl acetate, n-butyl propionate, n-pentyl propionate, n-hexyl propionate and n-heptyl propionate, and alkyl butyrates such as n-butyl butyrate, isobutyl butyrate and isobutyl isobutyrate; ethers such as PGME; ketones such as 2-heptanone, 2,6-dimethyl-4-heptanone and 2,5-dimethyl-4-hexanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; toluene, anisole and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. Suitable aqueous solvents include water or an aqueous base such as a quaternary ammonium hydroxide solution, for example tetramethylammonium hydroxide (TMAH). The solvent component of the composition is typically present in an amount of from 90 to 99 wt % based on the total composition.

The pattern treatment compositions can include one or more optional additives including, for example, surfactants and antioxidants. Such optional additives if used are each typically present in the composition in minor amounts such as from 0.01 to 10 wt % based on total solids of the composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121,L123, L31,L81, L101 and P123 (BASF, Inc.).

An antioxidant can be added to prevent or minimize oxidation of organic materials in the pattern treatment composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)2,4-bisoctyl-thio-1,3,5-triazine, n-octadecyl-3-(4'-hydroxy-3',5'-di-tert-butylphenyl)propionate, octylated phenol, aralkyl-substituted phenols, alkylated p-cresol and hindered phenol; bis-, tris- and poly-phenols such as 4,4'-dihydroxydiphenyl, methylenebis (dimethyl-4,6-phenol), 2,2'-methylene-bis-(4-methyl-6-tert-butylphenol), 2,2'-methylene-bis-(4-methyl-6-cyclohexylphenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-cross-linked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyldiphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The pattern treatment composition is preferably free of crosslinkers such as typically used in acid diffusion resist growth processes. These processes are known to suffer from proximity and size bias, where, for example, isolated holes shrink more than dense holes due to the concentration of acid in the remaining photoresist. In addition to preferably being free of crosslinkers, the pattern treatment compositions are preferably free of acids, acid generator compounds, for example, thermal acid generator compounds and photoacid generator compounds, as such compounds may limit the amount of trench/hole shrink achievable by the composition by their competing with acid and/or alcohol groups of the resist pattern for the hydrogen acceptor anchoring functionality of the composition.

The pattern treatment compositions can be prepared following known procedures. For example, the compositions can be prepared by dissolving the polymer and other optional solid components of the composition in the solvent components. The desired total solids content of the compositions will depend on factors such as the particular polymer(s) in the composition and desired final layer thickness. Preferably, the solids content of the pattern treatment compositions is from 1 to 10 wt %, more preferably from 1 to 5 wt %, based on the total weight of the composition.

Photoresist Compositions

Photoresist compositions useful in the invention include, for example, chemically-amplified photoresist compositions comprising a matrix polymer that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce a carboxylic acid or an alcohol group. Suitable photoresist compositions useful for the invention are commercially available.

For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene. The matrix resin typically includes one or more additional units formed from monomers providing one or more additional group chosen, for example, from lactone groups, polar groups and neutral groups. Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene, anisole and xylene; and ketones such as acetone, methyl-ethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable photoresists are known in the art and include, for example, photoresists described in US Patent Publications US20130115559A1, US20110294069A1, US20120064456A1, US20120288794A1, US20120171617A1, US20120219902A1 and US7998655B2.

Pattern Treatment Methods

Processes in accordance with the invention will now be described with reference to FIG. 2A-F, which illustrates an exemplary process flow for forming a photolithographic pattern by negative tone development.

FIG. 2A depicts in cross-section a substrate 100 which can include various layers and features. The substrate can be of a material such as a semiconductor, such as silicon or a compound semiconductor (e.g., III-V or II-VI), glass, quartz, ceramic, copper and the like.

Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers and can be organic, inorganic or a hybrid organic-inorganic material, for example a silicon-containing antireflective coating material. Suitable antireflective materials and methods of formation are known in the art. Antireflective materials are commercially available, for example, those sold under the AR™ trademark by Dow Electronic Materials (Marlborough, Mass. USA), such as AR™40A and AR™124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

The photoresist layer can next be soft baked to minimize the solvent content in the layer, thereby forming a tack-free coating and improving adhesion of the layer to the substrate. The soft bake can be conducted on a hotplate or in an oven, with a hotplate being typical. The soft bake temperature and time will depend, for example, on the particular material of the photoresist and thickness. Typical soft bakes are conducted at a temperature of from about 90 to 150° C., and a time of from about 30 to 90 seconds.

The photoresist layer 104 is next exposed to activating radiation through a patterned photomask 106 to create a difference in solubility between exposed and unexposed regions. References herein to exposing a photoresist composition to radiation that is activating for the composition indicate that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer 104, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 2B:
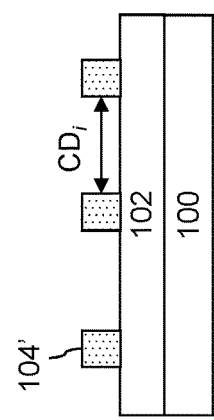

The exposed photoresist layer is next developed to remove unexposed regions, leaving exposed regions forming a negative resist pattern 104' having an initial critical dimension (CDi) as shown in FIG. 2B. Resist pattern 104' includes the carboxylic acid group and/or the alcohol group. The negative tone developer is an organic solvent developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene, anisole and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

The organic solvent(s) are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 120 seconds, or from 5 to 30 seconds being typical. Development is typically conducted at room temperature.

Following development, the resist pattern 104' can optionally be heat treated in a hardbake process to further remove solvent from the resist pattern. The optional hardbake is typically conducted with a hot plate or oven, and is typically conducted at a temperature of about 90° C. or higher, for example, from about 100 to 150° C., and a time of from about 30 to 120 seconds.

Figure 2C:
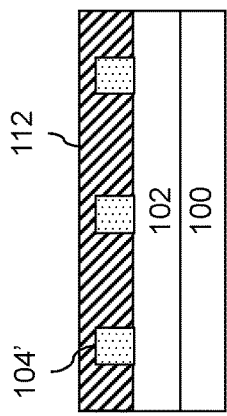

With reference to FIG. 2C, a pattern treatment composition as described herein is coated over the resist pattern 104' to form a pattern treatment composition layer 112. Depending on the particular process, the pattern treatment composition can be applied so as to cover the resist pattern entirely or to a height less than or equal to the thickness of the resist pattern so as not to cover the resist pattern top surface, depending on the particular application.

The pattern treatment composition layer 112 is typically next soft baked to remove solvent from the composition and to cause the polymer to diffuse and induce bonding between the anchoring portion of the polymer and the deprotected acid and/or alcohol group of the photoresist pattern. A typical soft bake for the pattern treatment composition is conducted at a temperature of from about 90 to 150° C., and a time of from about 30 to 120 seconds.

Figure 2D:
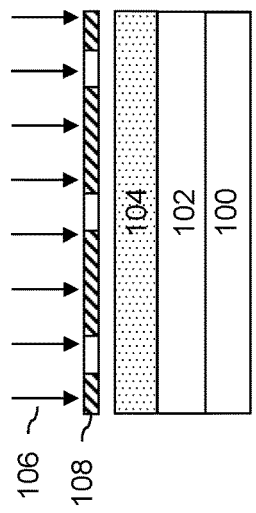

Residual pattern treatment composition including polymer that is not bonded to the resist pattern is next removed from the substrate by rinsing, leaving behind a layer 112' of the polymer bound to the resist pattern as shown in FIG. 2D. With removal of the residual pattern treatment composition, the effective thickness of the resist pattern sidewalls is increased, thereby reducing the spacing between adjacent lines or within a trench or hole pattern (CDf). Suitable rinsing solutions include organic solvent developers in which the polymer is soluble. Suitable materials include, for example, those developers described herein with respect to the NTD developers. Of these, n-butyl acetate and 2-heptanone are typical. The resulting image typically has an improved (i.e., reduced) surface roughness as compared with that of the resist pattern following development of the photoresist layer.

Optionally, a post-rinse bake can be conducted at a temperature above the $T_g$ of the block copolymer. This bake can provide beneficial results, for example, in the form of improved pattern roughness or circularity due to the thermodynamic drive of the polymer to minimize its interfacial area with air.

Figure 2E:
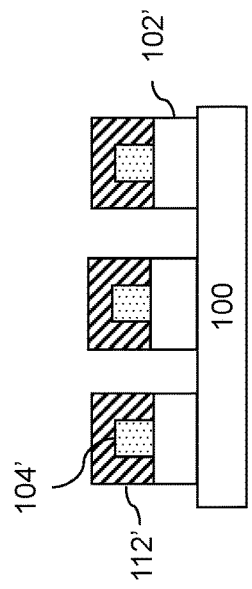
Figure 2F:
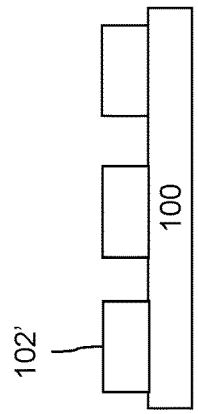

The one or more underlying layers 102 can next be selectively etched using the resist pattern 104' with bonded block copolymer 112' as an etch mask to expose the underlying substrate 100 and form patterns 102' as shown in FIG. 2E. Suitable etching techniques and chemistries for etching layers 102 are known in the art, with dry-etching processes such as reactive ion etching being typical. The resist pattern 104' and bonded block copolymer 112' are next removed from the substrate using known techniques, for example, an oxygen plasma ashing, leaving patterns 102' as shown in FIG. 2F.

The following non-limiting examples are illustrative of the invention.

EXAMPLES

Number and weight-average molecular weights, Mn and Mw, and polydispersity (PDI) values (Mw/Mn) for the alternating first blocks of the copolymers were measured by gel permeation chromatography (GPC) on a Waters alliance system equipped with a refractive index detector. Samples were dissolved in HPCL grade THF at a concentration of approximately 1 mg/mL and injected through four Shodex columns (KF805, KF804, KF803 and KF802). A flow rate of 1 mL/min and temperature of 35° C. were maintained. The columns were calibrated with narrow molecular weight PS standards (EasiCal PS-2, Polymer Laboratories, Inc.). For the hydrogen-acceptor-containing second blocks in the final block copolymers, the number average molecular weights Mn were calculated by NMR based on reactant feed charges.

Top-down scanning electron micrographs were acquired using a Hitachi S9380 SEM at 250K magnification. Cross-section SEM images were acquired after sectioning the wafer using an Amray 1910 scanning electron microscope. Critical dimension (CD) and pitch were determined based on the SEM images.

Pattern Treatment Composition Preparation

The following monomers were used to prepare Pattern Treatment Composition Polymers P1-P4 as described below:

M1
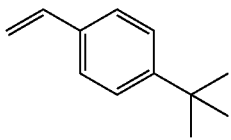

M2
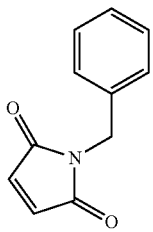

M3
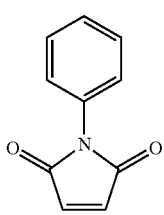

M4
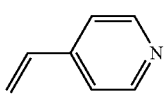

M5
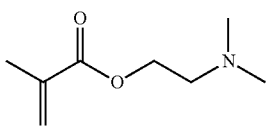

M6
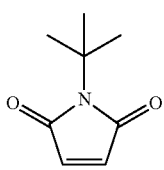

P1
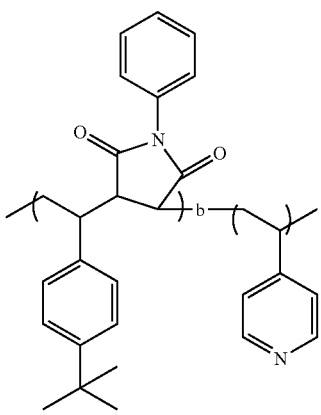

P2
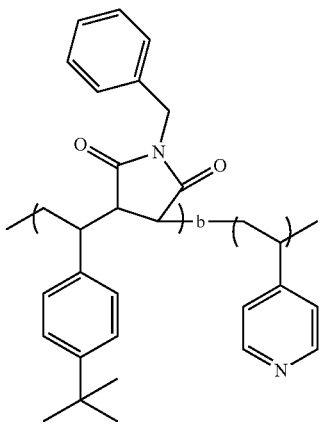

P3
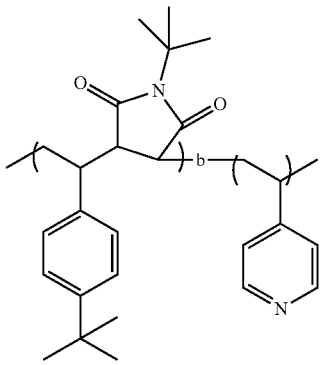

P4
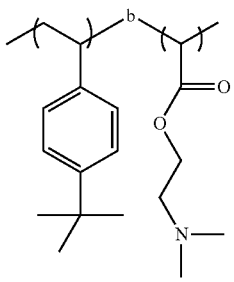

P5
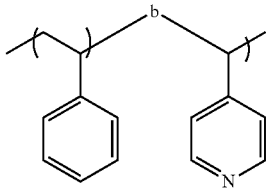

Prepolymer Synthesis:

Synthesis of Prepolymer 1 (PP1):

0.01 g dimethyl 2,2'-azobis(2-methylpropionate) (DMAMP), 6.5 g monomer M1 (tert-butyl styrene), 7 g monomer M2 (Benzyl maleimide), 0.061 g 2-cyanopropan-2-yl benzodithioate (CPBD), 20 mL PGMEA (Propylene glycol mono methyl ether acetate) and a magnetic stir bar were loaded into a 200 mL air-free flask. The mixture was freeze-pump-thawed three times with liquid nitrogen and the flask was then placed in a heat block at 70° C. for 16 hours. After the reaction, the flask was cooled. The reaction mixture was then precipitated into 500 mL of methanol. The precipitate was collected and re-precipitated. The polymer was collected and dried in a vacuum oven at 50° C.

overnight. The resulting Prepolymer PP1 [poly(tert-butyl styrene-alt-Benzyl maleimide)] had an Mn of 58 k (kg/mol) and a PDI of 1.89.

Synthesis of Prepolymer 2 (PP2):

0.016 g DMAMP, 10 g monomer M1 (tert-butyl styrene), 10.8 g monomer M3 (Phenyl maleimide), 0.061 g CPBD, 31.26 mL PGMEA and a magnetic stir bar were loaded into a 200 mL air-free flask. The mixture was freeze-pump-thawed three times with liquid nitrogen and the flask was then placed in a heat block at 70° C. for 16 hours. After the reaction, the flask was cooled. The reaction mixture was then precipitated into 500 mL of methanol. The precipitate was collected and re-precipitated. The polymer was collected and dried in a vacuum oven at 50° C. overnight. The resulting Prepolymer PP2 [poly((tert-butyl styrene)-alt-Phenyl maleimide)] had an Mn of 45 k (kg/mol) and a PDI of 1.99.

Synthesis of Prepolymer 3 (PP3):

0.003 g DMAMP, 1.5 g monomer M1 (tert-butyl styrene), 1.44 g monomer M6 (tert butyl maleimide), 0.02 g CPBD, 4.7 mL PGMEA and a magnetic stir bar were loaded into a 100 mL air-free flask. The mixture was freeze-pump-thawed three times with liquid nitrogen and the flask was then placed in a heat block at 70° C. for 16 hours. After the reaction, the flask was cooled. The reaction mixture was then precipitated into 200 mL of methanol. The precipitate was collected and re-precipitated. The polymer was collected and dried in a vacuum oven at 50° C. overnight. The resulting Prepolymer PP3 [poly((tert-butyl styrene-alt-t-butyl maleimide)] had an Mn of 22 k (kg/mol) and a PDI of 1.36.

Block Copolymer Synthesis

Example 1 (P1)

10.0 g Prepolymer PP1, 2.0 g Monomer M4 [4-vinyl pyridine], 0.012 g DMAMP, 19 mL Dimethylformamide (DMF) and a magnetic stir bar were loaded into a 200 mL air-free reactor. The mixture was freeze-pump-thawed three times with liquid nitrogen. The reactor was then sealed with a septum and placed in a heat block at 70° C. for 16 hours. After the reaction, the flask was cooled. The reaction mixture was then precipitated into 500 mL methanol. The precipitate was collected and re-precipitated. The resulting Polymer P1 [poly(tert-butyl styrene-alt-Benzyl maleimide)-b-poly(4-vinyl pyridine)] was collected and dried in a vacuum oven at room temperature overnight. Table 1 summarizes the molecular weight properties of the polymer.

Example 2 (P2)

10.0 g Prepolymer PP2, 1.0 g Monomer M4 [4-vinyl pyridine], 0.01 g DMAMP, 9.51 mL DMF and a magnetic stir bar were loaded into a 200 mL air-free reactor. The mixture was freeze-pump-thawed three times with liquid nitrogen. The reactor was then sealed with a septum and placed in a heat block at 70° C. for 16 hours. After the reaction, the flask was cooled. The reaction mixture was then precipitated into 500 mL methanol. The precipitate was collected and re-precipitated. The resulting Polymer P2 [poly((tert-butyl styrene-alt-Phenyl maleimide)-b-poly(4-vinyl pyridine)] was collected and dried in a vacuum oven at room temperature overnight. Table 1 summarizes the molecular weight properties of the polymer.

Example 3 (P3)

3.0 g Prepolymer PP3, 1.5 g Monomer M4 [4-vinyl pyridine], 0.007 g DMAMP, 7.13 mL DMF and a magnetic stir bar were loaded into a 100 mL air-free reactor. The mixture was freeze-pump-thawed three times with liquid nitrogen. The reactor was then sealed with a septum and placed in a heat block at 70° C. for 16 hours. After the reaction, the flask was cooled. The reaction mixture was then precipitated into 200 mL methanol. The precipitate was collected and re-precipitated. The resulting Polymer P3 [poly((tert-butyl styrene-alt-t-butyl maleimide)-b-poly(4-vinyl pyridine)] was collected and dried in a vacuum oven at room temperature overnight. Table 1 summarizes the molecular weight properties of the polymer.

Comparative Example 1 (P4)

Polymer P4 was synthesized using Monomer M1 [tert-butyl styrene] and Monomer M5 [Dimethyl amino ethyl methacrylate]. The monomers and solvents were freeze-pump-thawed three times to remove oxygen. The monomers were further purified prior to use with activated $Al_2O_3$ and were diluted with cyclohexane to about 50 vol % concentration. 200 g tetrahydrofuran (THF) was added to the reactor containing pre-dried LiCl. The contents were cooled to −78° C. in a dry ice/isopropanol bath. The THF was titrated with sec-butyl lithium (SBL) initiator in 0.7M cyclohexane until a green color was observed. The reaction bath was warmed to room temperature until the green color fully disappeared. The reaction bath was again cooled to −78° C. followed by addition of diphenyl ethylene (DPE: 0.07 g) and SBL initiator (0.44 ml. 0.43M) to yield a bright red color. 19.05 g Monomer M1 was fed to the reactor and the contents were stirred for four hours. A reaction aliquot was collected by cannulating the polymer mixture in oxygen-free methanol. The precipitated polymer was analyzed by GPC for Mn. 0.95 g of Monomer M5 was added to the reactor and the mixture was stirred for four hours at −78° C. The reaction was quenched with oxygen-free methanol. The reaction product was precipitated out in methanol to yield a powdery white precipitate which was vacuum-dried in an oven at 50° C. for eight hours to yield a dry polymer, Polymer P4 [poly((tert-butyl styrene)-b-poly(Dimethyl amino ethyl methacrylate)]. Table 1 summarizes the molecular weight properties of the polymer.

Comparative Example 2 (P5)

Table 1 summarizes the molecular weight properties of Polymer P5 [Poly (styrene)-b-(4-vinyl pyridine) (Polymer Source Inc.)].

TABLE 1

| Example | Block Copolymer | Mn $1^{st}$ block (GPC) | PDI $1^{st}$ Block (GPC) | Mn $2^{nd}$ block (NMR) |
|---|---|---|---|---|
| 1 | P1 | 58k | 1.89 | 15k |
| 2 | P2 | 45k | 1.99 | 5k |
| 3 | P3 | 22k | 1.36 | 1k |
| Comp. 1 | P4 | 100k | 1.04 | 5k |
| Comp. 2 | P5 | 60k* | 1.1* | 4k* |

*Data as reported by vendor

Photoresist Composition Preparation 17.73 g Matrix Polymer A (15 wt % in PGMEA), 16.312 g PAG A solution (1 wt % in methyl-2-hydroxy isobutyrate), 3.463 g PAG B solution (1 wt % in PGMEA), 6.986 g PAG C solution (2 wt % in methyl-2-hydroxyisobutyrate), 4.185 g trioctylamine (1 wt % solution in PGMEA), 0.248 g Polymer Additive A (25 wt % solution in PGMEA), 25.63 g PGMEA, 9.69 g gamma-butyrolactone and 22.61 g methyl-2-hydroxyisobutyrate were mixed and filtered through a 0.2 μm Nylon filter to form Photoresist Composition PRC-1.

Photoresist Composition PRC-1 was coated over the bilayer stack and softbaked at 90° C. for 60 seconds on a TEL CLEAN TRACK™ LITHIUS™ i+ coater/developer, to a

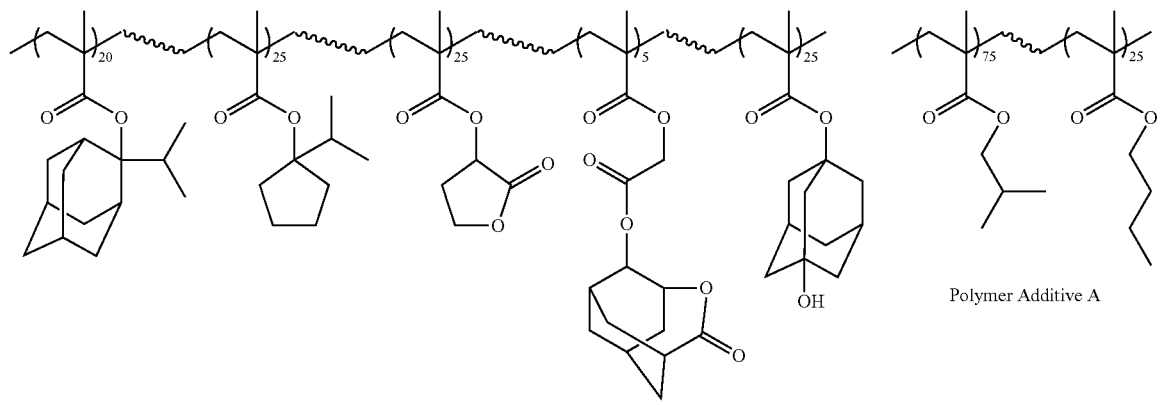

Matrix Polymer A

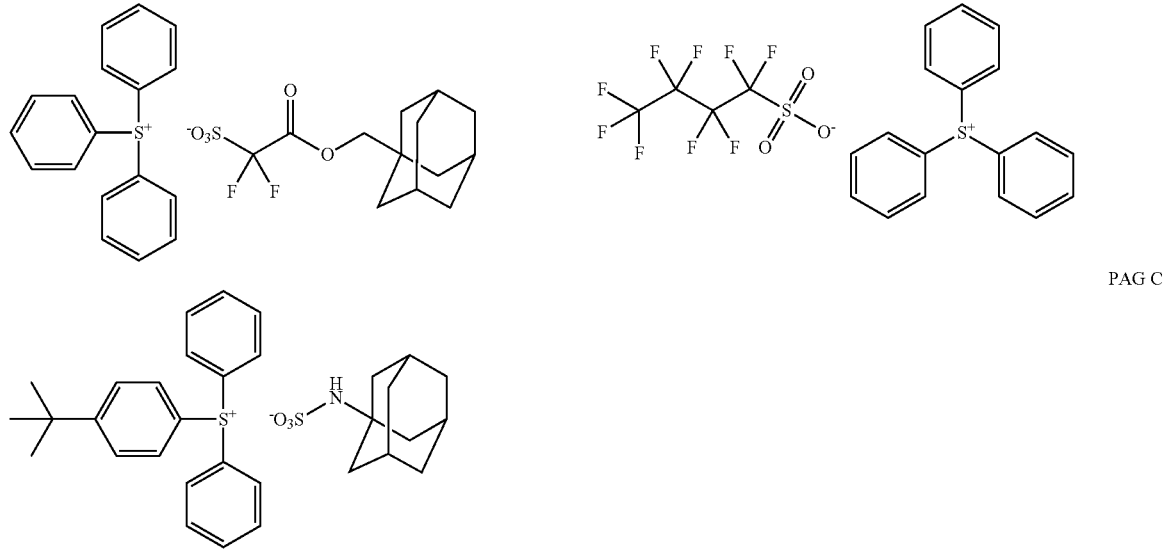

PAG A

PAG B

PAG C

Pattern Treatment Composition (PTC) Preparation

Pattern treatment compositions were prepared by dissolving the block copolymers as described in Table 2 in 2-heptanone in amount to form 3 wt % solutions. The compositions were filtered with a 0.2 micron ultra-high molecular weight polyethylene (UPE) filter.

TABLE 2

| Example | Pattern Treatment Composition | Polymer | Polymer |
|---|---|---|---|
| 4 | PTC-1 | P1 | P(M1-alt-M2)-b-P(M4) |
| 5 | PTC-2 | P2 | P(M1-alt-M3)-b-P(M4) |
| 6 | PTC-3 | P3 | P(M1-alt-M6)-b-P(M4) |
| Comp. 3 | PTC-4 | P4 | P(M1)-b-P(M5) |
| Comp. 4 | PTC-5 | P5 | P(M7)-b-P(M4) |

Lithographic Processing and Evaluation
Shrink of Line-space Patterns

Figure 3:
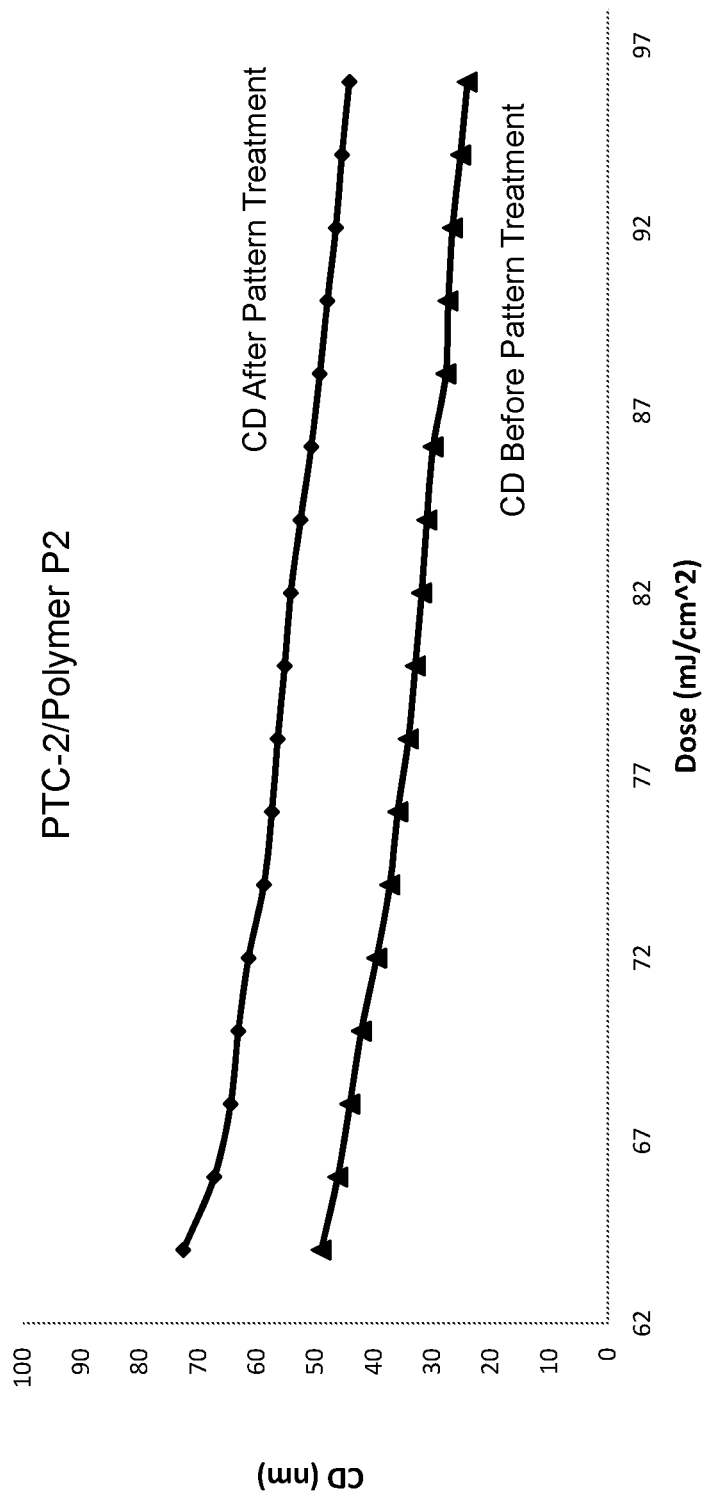
FIG. 3 is a plot of CD as a function of dose before and after pattern treatment with a pattern treatment composition of the invention.

Eight-inch silicon wafers having a bilayer stack including a 220 Å silicon-containing antireflective coating (SiARC) layer over a 1350 Å organic underlayer were provided. target resist thickness of 1000 Å. The photoresist layer was exposed using an ASML 1100 scanner with a numerical aperture (NA) of 0.75 and Dipole-35Y illumination through a reticle including line/space patterns with a pitch of 150 nm at various doses across each wafer. A post-exposure bake was performed at 90° C. for 60 seconds, and the photoresist layer was developed using an n-butylacetate (nBA) developer to form line/space patterns with a pitch of 150 nm and various critical dimensions (CDs) across the wafers. One of the resist-patterned wafers was observed by SEM as a control without further processing, and the average spacing between lines ($CD_i$) was measured. Other wafers were overcoated with a respective pattern treatment composition designated in Table 3 by spin coating at 1500 rpm on a TEL CLEAN TRACK™ LITHIUS™ i+ coater/developer. The patterned wafers were soft baked at 100° C. for 60 seconds, and rinsed with n-butylacetate on a spin-coater. The resulting patterns were observed by SEM and the average spacing between lines ($CD_f$) was measured at mid-height of the pattern. The average shrink amount $\Delta CD$ ($=CD_i-CD_f$) for the pattern treatment compositions was calculated. The patterns were also observed by cross-section SEM images for the presence of scum. The results for scumming and shrink amount are shown in Table 3. FIG. 3 provides a representative plot of CD versus exposure dose before and after pattern treatment for pattern treatment composition PTC-2. It was found that the shrink amounts (ΔCD) at each dose over the measured ranges for all of the pattern treatment compositions measured were substantially constant, indicating low proximity bias for each of the compositions. It was further observed that the pattern treatment formulations of the invention resulted in no scumming, whereas the comparative formulation resulted in scumming.

Shrink of Contact Hole Patterns

Eight-inch silicon wafers having a bilayer stack of 220 Å silicon-containing antireflective coating (SiARC) layer over 1350 Å organic underlayer were provided. Photoresist composition PRC-1 was coated over the bilayer stack and soft baked at 90° C. for 60 seconds on a TEL CLEAN TRACK™ LITHIUS™ i+ coater/developer, to a target resist thickness of 1000 Å. The photoresist layer was exposed using an ASML 1100 scanner with a numerical aperture (NA) of 0.75 and Quadrapole 30 illumination through a reticle including contact hole patterns with a pitch of 300 nm at various doses across each wafer. A post-exposure bake was performed at 90° C. for 60 seconds, and the photoresist layer was developed using an n-butylacetate (nBA) developer to form contact hole patterns with a pitch of 300 nm and various critical dimensions (CDs) across the wafers. One of the resist-patterned wafers was observed by SEM as a control without further processing, and the average contact hole diameter ($CD_i$) was measured at mid-height of the pattern. Another wafer was overcoated with Pattern Treatment Composition PTC-3 by spin coating at 1500 rpm on a TEL CLEAN TRACK™ LITHIUS™ i+ coater/developer. The patterned wafer was soft baked at 100° C. for 60 seconds, and rinsed with n-butylacetate on a spin-coater. The resulting patterns were observed by SEM and the average contact hole diameter ($CD_f$) was measured at mid-height of the pattern. The average shrink amount ΔCD (=$CD_i$-$CD_f$) for the pattern treatment composition was calculated. The results are shown in Table 3. The shrink amount (ΔCD) at each dose over the ranges tested was substantially constant, indicating low proximity bias for PTC-3. Based on observation by top-down SEM, no scumming was observed.

TABLE 3

| Example | Pattern Treatment Composition | Block Copolymer | Average Shrink Amount (ΔCD) | Resist Pattern | Scumming |
|---|---|---|---|---|---|
| 7 | PTC-1 | P1 | 20.8 nm | L/S | No |
| 8 | PTC-2 | P2 | 21 nm | L/S | No |
| 9 | PTC-3 | P3 | 8 nm | C/H | No* |
| Comp. 5 | PTC-4 | P4 | 26 nm | L/S | Yes |
| Comp. 6 | PTC-5 | P5 | 20.4 nm | L/S | Yes |

L/S = line/space pattern;
C/H = contact hole pattern;
*Based on top-down SEM and for CH (other scumming determinations based on cross-section SEMs.

What is claimed is:
1. A block copolymer, comprising:
a first block comprising an alternating copolymer, wherein the alternating copolymer is formed by polymerization of an electron acceptor monomer with an electron donating monomer; and
a second block comprising a unit comprising a hydrogen acceptor, wherein the hydrogen acceptor is a group chosen from amine, imine, diazine, diazole, optionally substituted pyridine, and combinations thereof.

2. The block copolymer of claim 1, wherein the alternating copolymer comprises a repeat unit of the following general formula (I):

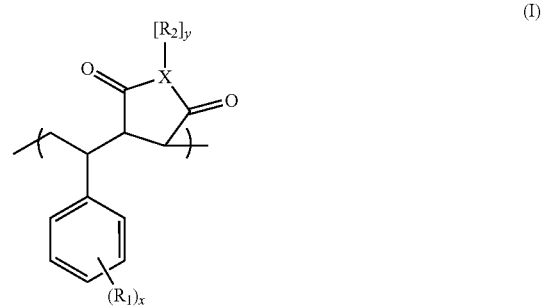

wherein: $R_1$ is independently chosen from halogen, hydroxyl, optionally substituted C1-10 alkyl, C1-10 alkoxy, C1-10 carboxyl, optionally substituted C6-14 aryl and optionally substituted C6-14 aryloxy; $R_2$ is chosen from hydrogen, optionally substituted C1-10 alkyl and optionally substituted C6-14 aryl; X is an oxygen or nitrogen atom; x is an integer from 0 to 5; and y is 0 or 1, provided that when X is an oxygen atom, y is 0, and when X is a nitrogen atom, y is 1.

3. The block copolymer of claim 2, wherein X is a nitrogen atom.

4. The block copolymer of claim 1, wherein the hydrogen acceptor group is an amine or an optionally substituted pyridine group.

5. A pattern treatment composition, comprising the block copolymer of claim 1 and a solvent.

6. The pattern treatment composition of claim 5, wherein the solvent is an organic solvent.

7. The pattern treatment composition of claim 5, wherein the hydrogen acceptor is a group chosen from amine, imine, diazine, diazole, optionally substituted pyridine, and combinations thereof.

8. The pattern treatment composition of claim 5, wherein the alternating copolymer comprises a repeat unit of the following general formula (I):

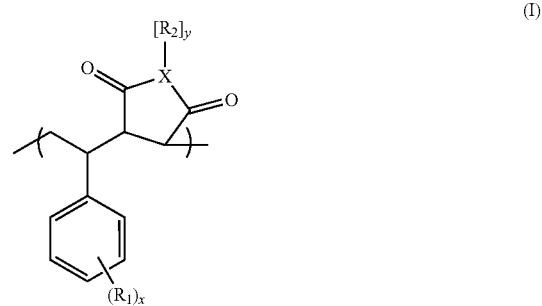

wherein: $R_1$ is independently chosen from halogen, hydroxyl, optionally substituted C1-10 alkyl, C1-10 alkoxy, C1-10 carboxyl, optionally substituted C6-14 aryl and optionally substituted C6-14 aryloxy; $R_2$ is chosen from hydrogen, optionally substituted C1-10 alkyl and optionally substituted C6-14 aryl; X is an oxygen or nitrogen atom; x is an integer from 0 to 5; and y is 0 or 1, provided that when X is an oxygen atom, y is 0, and when X is a nitrogen atom, y is 1.

9. The pattern treatment composition of claim 8, wherein X is a nitrogen atom.

10. The pattern treatment composition of claim 5, wherein the hydrogen acceptor group is an amine or an optionally substituted pyridine group.

11. A pattern treatment method, comprising:
  (a) providing a substrate comprising a patterned feature on a surface thereof;
  (b) applying a pattern treatment composition of claim 5 to the patterned feature; and
  (c) rinsing residual pattern treatment composition from the substrate, leaving a portion of the block copolymer bonded to the patterned feature.

12. The pattern treatment method of claim 11, wherein the patterned feature is a photoresist pattern.

13. The pattern treatment method of claim 12, wherein the photoresist pattern is formed by a negative tone development process comprising applying a layer of a photoresist composition to the substrate, exposing the photoresist composition layer to activating radiation through a patterned photomask, and developing the exposed photoresist composition layer with an organic solvent developer to remove unexposed regions of the photoresist composition layer.

14. The pattern treatment method of claim 11, wherein the rinsing of residual pattern treatment composition from the substrate comprises an organic solvent rinse.

15. The pattern treatment method of claim 11, wherein the hydrogen acceptor is a group chosen from amine, imine, diazine, diazole, optionally substituted pyridine, and combinations thereof.

16. The pattern treatment method of claim 11, wherein the alternating copolymer comprises a repeat unit of the following general formula (I):

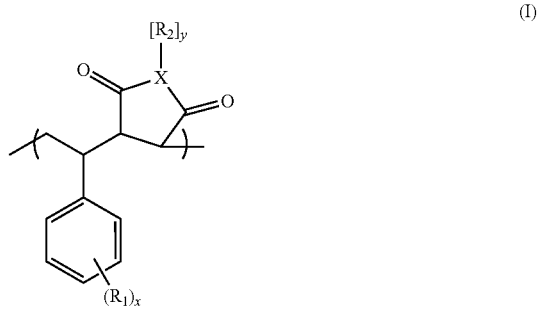

wherein: $R_1$ is independently chosen from halogen, hydroxyl, optionally substituted C1-10 alkyl, C1-10 alkoxy, C1-10 carboxyl, optionally substituted C6-14 aryl and optionally substituted C6-14 aryloxy; $R_2$ is chosen from hydrogen, optionally substituted C1-10 alkyl and optionally substituted C6-14 aryl; X is an oxygen or nitrogen atom; x is an integer from 0 to 5; and y is 0 or 1, provided that when X is an oxygen atom, y is 0, and when X is a nitrogen atom, y is 1.

17. The pattern treatment method of claim 16, wherein X is a nitrogen atom.

18. The pattern treatment method of claim 11, wherein the hydrogen acceptor group is an amine or an optionally substituted pyridine group.

* * * * *